United States Patent
Yoon

(10) Patent No.: US 8,097,297 B2
(45) Date of Patent: Jan. 17, 2012

(54) METHOD OF MANUFACTURING FLEXIBLE DISPLAY SUBSTRATE HAVING REDUCED MOISTURE AND REDUCED OXYGEN PERMEABILITY

(75) Inventor: Choon Sup Yoon, Daejon (KR)

(73) Assignee: Korea Advanced Institute of Science and Technology (KAIST), Daejeon (KR)

( * ) Notice: Subject to any disclaimer, the term of this patent is extended or adjusted under 35 U.S.C. 154(b) by 78 days.

(21) Appl. No.: 12/688,822

(22) Filed: Jan. 15, 2010

(65) Prior Publication Data

US 2011/0175250 A1    Jul. 21, 2011

(51) Int. Cl.
*B05D 3/02*    (2006.01)
(52) U.S. Cl. ..... 427/171; 427/365; 427/384; 427/385.5; 427/393.5
(58) Field of Classification Search ........................ None
See application file for complete search history.

(56) References Cited

U.S. PATENT DOCUMENTS

| | | | |
|---|---|---|---|
| 6,017,584 A * | 1/2000 | Albert et al. | 427/213.3 |
| 6,120,839 A * | 9/2000 | Comiskey et al. | 427/213.3 |
| 6,392,785 B1 * | 5/2002 | Albert et al. | 359/296 |
| 2006/0244355 A1 * | 11/2006 | Park et al. | 313/479 |
| 2007/0188681 A1 * | 8/2007 | Cho et al. | 349/114 |
| 2009/0225397 A1 * | 9/2009 | Amundson et al. | 359/296 |

* cited by examiner

*Primary Examiner* — Erma Cameron
(74) *Attorney, Agent, or Firm* — Hershkovitz & Associates, LLC; Abraham Hershkovitz

(57) ABSTRACT

In a method of manufacturing a flexible display substrate having reduced moisture permeability and reduced oxygen permeability, nanosized or microsized particles are uniformly dispersed in a molten polymer matrix. The molten polymer matrix are formed into plate-shaped molten polymer. The plate-shaped molten polymer is extruded between two extruding rollers to form a polymer or plastic sheet, to orient the nanosized or microsized particles in parallel with a surface of the polymer or plastic sheet. The polymer or plastic sheet is stretched between a glass transition temperature and a melting point to form a polymer or plastic film, exfoliating and orienting the nanosized or microsized particles further in parallel with a surface of the polymer or plastic film. The polymer or plastic film is coated with an organic film to flatten a surface of the flexible display substrate. Heat treatment is performed to cure the organic film.

9 Claims, 4 Drawing Sheets

METHOD OF MANUFACTURING FLEXIBLE DISPLAY SUBSTRATE HAVING REDUCED MOISTURE AND REDUCED OXYGEN PERMEABILITY

BACKGROUND OF THE INVENTION

1. Technical Field

The present invention relates to a flexible display substrate, and, more particularly, to a method of manufacturing a flexible display substrate having low moisture permeability and oxygen permeability, which can inhibit and prevent the shortening of the lifespan of organic devices attributable to extraneous moisture or oxygen.

2. Description of the Related Art

Liquid crystal displays (LCDs), in which a glass substrate is used as a substrate, were first developed early in the 1960's, and have been widely used in information display apparatuses, such as calculators, clocks, mobile phones, personal digital assistants (PDAs), audios, videos, computers, automobile instrument panels and the like. However, such LCDs, whose substrate is made of glass, are problematic although they are widely used.

The problems of these LCDs are caused by characteristics of the glass substrate which is used. That is, the LCDs are problematic in that the glass substrate which is used is fragile, heavy and inflexible and in that it is of limited thickness. In order to solve the above problems, it is required to replace a glass substrate with a plastic substrate.

Recently, with the advancement of display devices, it has been required that gas barrier films used in liquid crystal displays (LCDs) and organic light emitting diodes (OLEDs) be lighter and larger, and that the gas barrier films be easy to bend and fold such that they can be used in flexible displays.

Therefore, a transparent plastic substrate or a resin film-based substrate is being studied instead of a glass substrate which is heavy and fragile, and which is difficult to be used as a large area substrate. That is, it is required that the substrates used in liquid crystal displays (LCDs), organic light emitting diodes (OLEDs) displays or e-paper displays (EPDs) have high mechanical flexibility and excellent gas barrier properties.

However, the gas barrier properties of a plastic substrate or a resin film-based substrate are not better than those of a glass substrate, so that water vapor or oxygen permeates them. As a consequence, the lifespan and quality of liquid crystal displays (LCDs) or organic light emitting diodes (OLEDs) displays are deteriorated.

In order to solve such a problem, a film (transparent plastic substrate) having an excellent gas barrier property was fabricated by depositing a metal oxide film on top of the transparent plastic substrate. For example, a gas barrier film, which is fabricated by placing a silicon oxide film on a plastic film using vapor deposition, and a gas barrier film, on which an aluminum oxide film is formed, has been proposed.

Meanwhile, since the above-mentioned gas barrier films have a high water vapor transmission rate of 1 g/m²/day, which is measured by the Mocon method, there is a problem in that the water vapor barrier property of the above-mentioned gas barrier films is not satisfactory. In order to solve this problem, a moisture-proof film, which is formed by vapor-depositing at least one metal oxide selected from the group consisting of indium (In) oxide, tin (Sn) oxide, zinc (Zn) oxide and titanium (Ti) oxide on polyethylene terephthalate, has been proposed. However, this moisture-proof film is also problematic in that it does not satisfy the conditions for moisture permeability or mechanical flexibility.

The reason why a film (a flexible substrate) is required to have moisture-proof properties while high definition liquid crystal displays (LCDs) or organic light emitting diodes (OLEDs) displays are increasingly used is because, when water vapor or oxygen permeates into an organic light emitting diodes (OLEDs) display device, the organic light emitting diodes (OLEDs) display device is remarkably deteriorated by moisture existing in the interface between its cathode layer and organic layer, and dark spots where no light emits, occur. That is, extraneous moisture or oxygen degrades organic molecules, thus shortening the lifespan of the organic light emitting diodes (OLEDs) display device.

SUMMARY OF THE INVENTION

Accordingly, the present invention has been made to solve the above-mentioned problems, and an aspect of the present invention is to provide a method of manufacturing a flexible display substrate having low oxygen permeability and low moisture permeability, which can increase the lifespan of a display device by decreasing the permeation rate of extraneous moisture or oxygen.

Another aspect of the present invention is to provide a method of manufacturing a flexible display substrate having low oxygen permeability and low moisture permeability, which can greatly reduce its production cost by embedding nanosized or microsized plate-like particles for blocking water therein.

Still another aspect of the present invention is to provide a method of manufacturing a flexible display substrate having low oxygen permeability and low moisture permeability, which can be easily and efficiently manufactured by embedding plate-like particles for blocking water vapor therein using a roll-to-roll process.

In order to accomplish the above aspects, an aspect of the present invention provides a method of manufacturing a flexible display substrate having low moisture permeability and low oxygen permeability, on which an organic device is mounted, comprising the steps of: a) uniformly dispersing nanosized or microsized particles in a molten polymer matrix; b) forming the molten polymer matrix dispersed with the nanosized or microsized particles into plate-shape molten polymer, and then extruding the plate-shape molten polymer between two extruding rollers to form a polymer or plastic sheet, thereby orienting the nanosized or microsized particles in parallel with a surface of the polymer or plastic sheet; c) stretching the polymer or plastic sheet at the temperatures between the glass transition temperature and the melting point to form a polymer or plastic film, thus improving exfoliation of the nanosized or microsized particles, and orienting the nanosized or microsized particles to a higher degree in parallel with a surface of the polymer or plastic film; d) coating the polymer or plastic film with an organic film to flatten the surface of the flexible display substrate; and e) performing heat treatment to cure the organic film.

In the method, the flexible display substrate may be a polymer or plastic film, and each of the nanosized or microsized particles may have a plate-like structure.

Further, the nanosized or microsized particles may include at least one selected from among saponite particles, montmorillonite particles, bentonite particles, mica particles and glass particles.

Further, the nanosized or microsized particles may include at least one element selected from among Si, B, Li, Na, K, Mg, Ca, Ti, Al, Ba, Zn, Ga, Ge, Bi and Fe.

BRIEF DESCRIPTION OF THE DRAWINGS

The above and other aspects, features and advantages of the present invention will be more clearly understood from the following detailed description taken in conjunction with the accompanying drawings, in which.

DESCRIPTION OF THE PREFERRED EMBODIMENTS

Hereinafter, an embodiment of the present invention will be described in detail with reference to the attached drawings.

Figure 1:
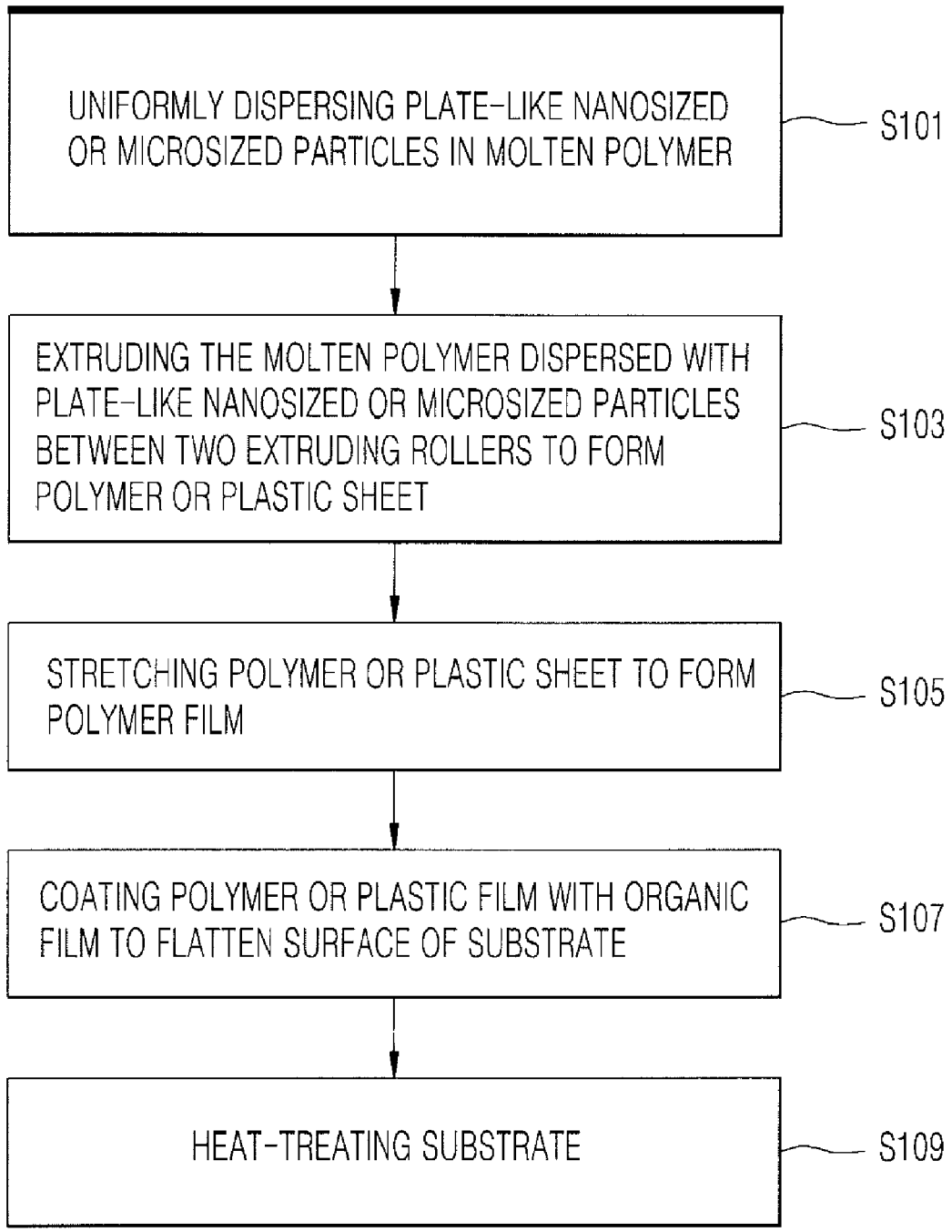
FIG. 1 is a flowchart showing a method of manufacturing a flexible display substrate according to the present invention.
Figure 2:
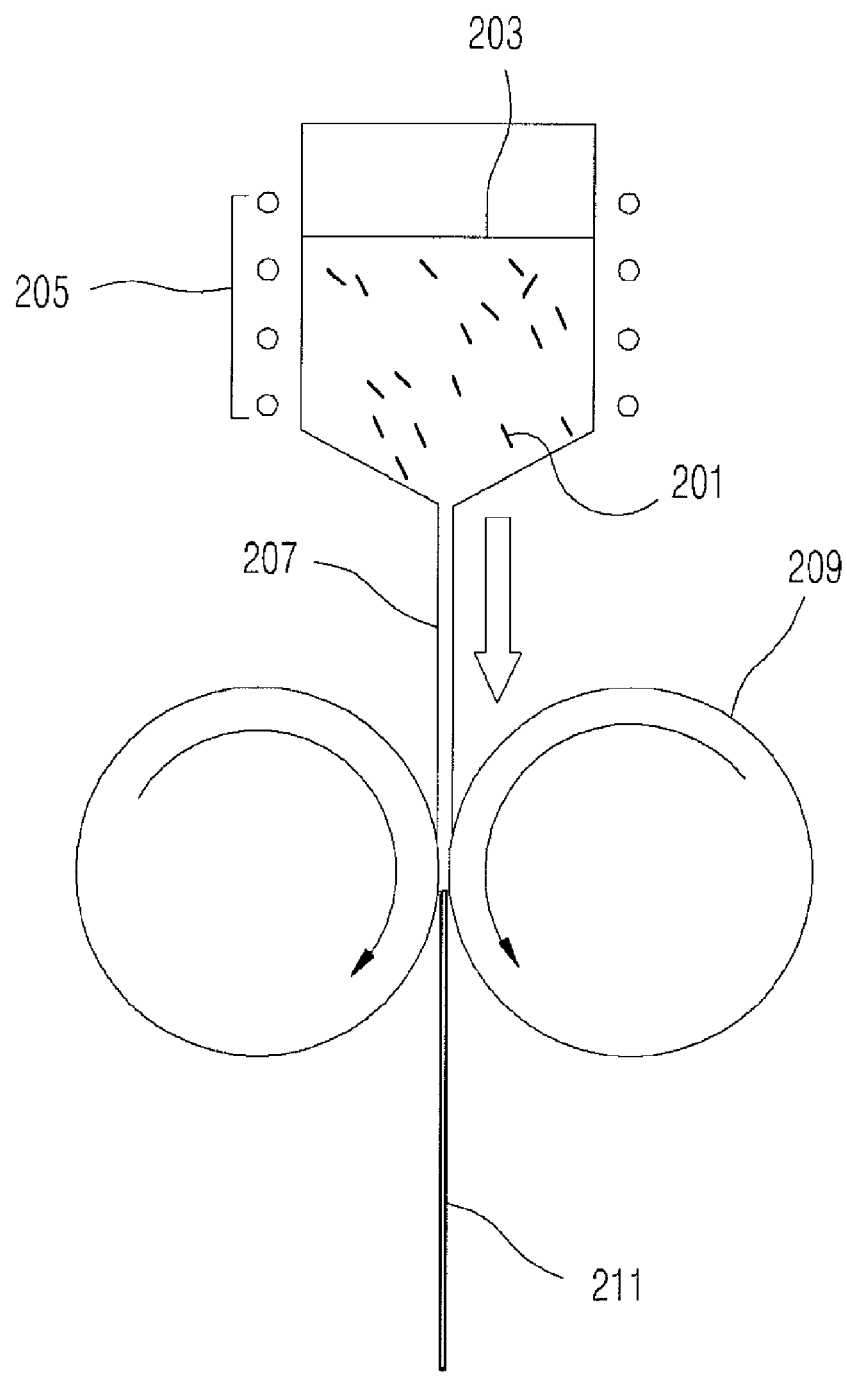
FIG. 2 is a schematic view of an apparatus for a process of forming a plastic sheet according to the present invention.

FIG. 1 is a flowchart showing a method of manufacturing a flexible display substrate according to the present invention, and FIG. 2 is a schematic view of an apparatus for a process of forming a plastic sheet according to the present invention. As shown in FIGS. 1 and 2, in step 101 (S101), a polymer, which is used as a matrix material of a flexible display substrate, is melted, and then nanosized or microsized particles are uniformly dispersed in the molten polymer. In order to disperse the nanosized or microsized particles uniformly, the nanosized or microsized inorganic particles may be chemically bonded with organic molecules which can make nanosized or microsized particles to mix easily with the molten polymer.

The nanosized or microsized particles 201 are provided in a plate-like shape. Examples of the nanosized or microsized particles 201 may include saponite particles, montmorillonite particles, bentonite particles, mica particles and glass particles. In the present invention, the nanosized or microsized particles 201 may include at least one element selected from among Si, B, Li, Na, K, Mg, Ca, Ti, Al, Ba, Zn, Ga, Ge, Bi and Fe. The nanosized or microsized particles 201 may have a particle size on the nanometer or micrometer scale, preferably, 10 nm~100 μm.

In step 103 (S103), the molten polymer 203 including the dispersed nanosized or microsized particles 201 is heated by a heater 205 to a predetermined temperature, and then the heated molten polymer 203 passes through a very long rectangular-shaped nozzle to form plate-shaped molten polymer 207, and then the plate-shaped molten polymer 207 is extruded between two extruding rollers 209 to form a polymer or plastic sheet 211. The term "polymer" applied to the present invention can be used together with the term "plastic" below the melting temperature of a polymer. Above the melting temperature of a polymer, only "polymer" or "molten polymer" may be used. Therefore, the terms "plastic sheet" and "plastic film", which are described in the present invention, may be replaced by "polymer sheet" and "polymer film", respectively, below the melting temperature of a polymer.

The plastic sheet 211 has a thickness of 1 μm~2 mm, and is made of any one polymer selected from among polyestersulfone, polyethylene, polycarbonate, polystyrene, polyethylene terephthalate, polyethylene naphthalate, polybutylene terephthalate, polyphenylene sulfide, polypropylene, aramid, polyamideimide, polyimide, aromatic polyimide, polyetherimide, acrylonitrile butadienestyrene and polyvinyl chloride.

Further, the plastic sheet 211 may be formed using various commonly-known forming methods, such as extrusion, injection, pressing and the like. The extruding rollers 209 are heated in order to maintain their surface temperatures between the glass transition temperature and the melting point of the polymer matrix material. The plate-shape molten polymer 207 is extruded after the extruding rollers 209 have been heated to a predetermined temperature for a predetermined time.

Subsequently, in step 105 (S105), the plastic sheet 211 is stretched to form a plastic film, that is, a plastic thin film 213, so that the nanosized or microsized plate-like particles 201 are oriented in parallel with the surface of the plastic thin film 213. In this case, the nanosized or microsized plate-like particles 201 are oriented in parallel with the surface of the plastic thin film 213 through a procedure of orienting polymer chains by applying mechanical force to the plastic sheet 211. It is preferred that the thermal contraction rate of the plastic sheet 211 should be 0.1% or less, preferably 0.05% or less, when the plastic sheet 211 is heat-treated at a temperature of 200° C. for 10 minutes.

Figure 3:
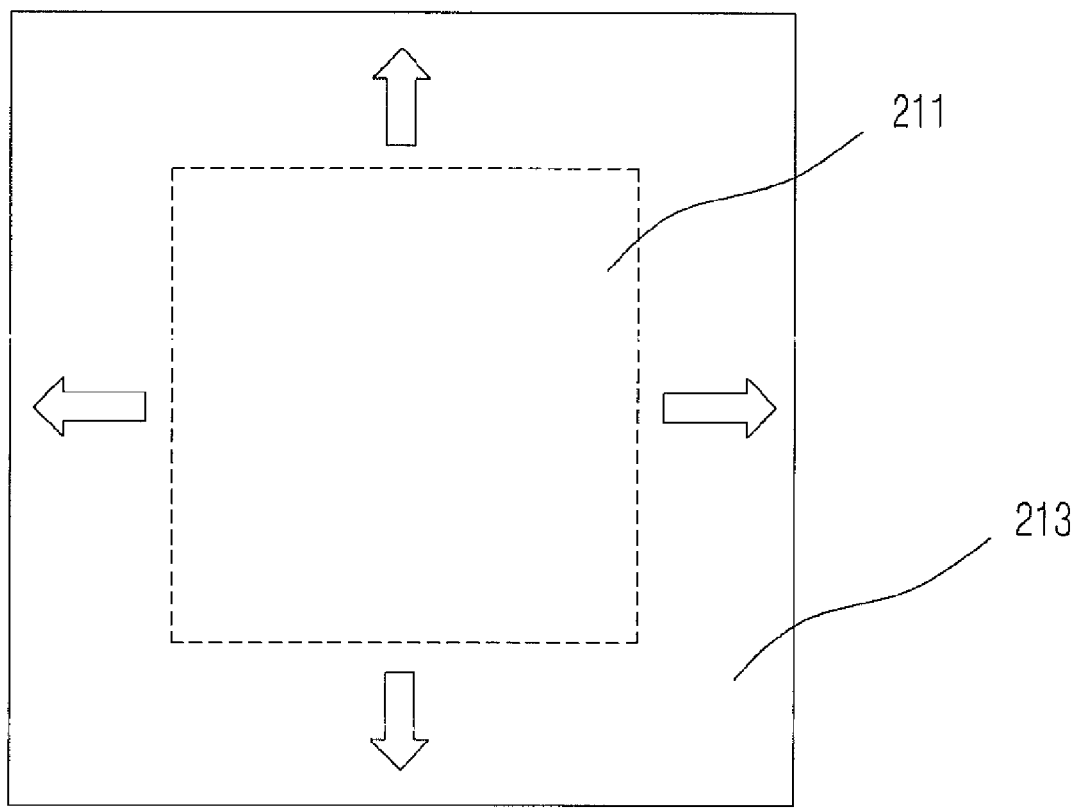
FIG. 3 is a schematic view showing a process of forming a plastic film by stretching horizontally and vertically a plastic sheet prepared according to the present invention.

FIG. 3 is a schematic view showing a process of forming a plastic film 213 by stretching a plastic sheet 211 horizontally or/and vertically. The plastic film 213 is formed by stretching an unstretched plastic sheet 211 horizontally or/and vertically with a stretch ratio of 2.0~10.0 at a predetermined temperature. Therefore, the nanosized or microsized particles 201 can be exfoliated, and oriented to be more in parallel with the surface of the plastic thin film 213 although they were oriented to some degree by the extruding rollers 209.

Figure 4:
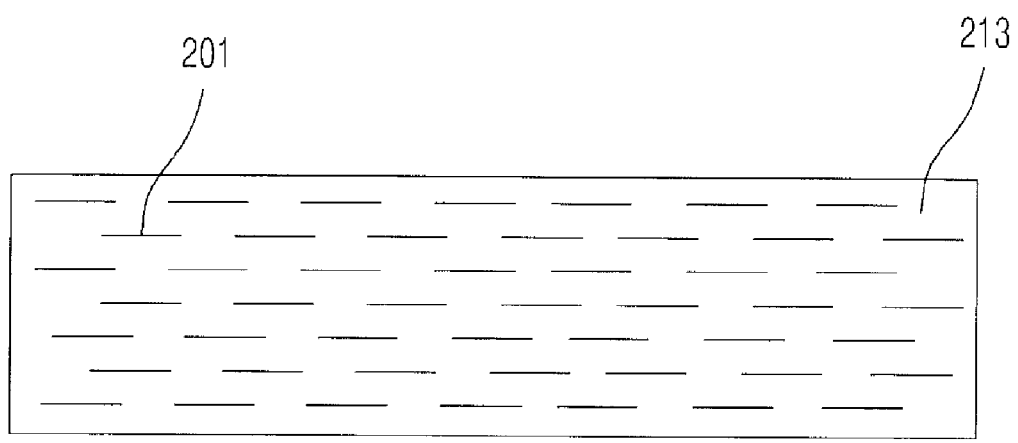
FIG. 4 is a view showing a flexible display substrate manufactured by the method, where nanosized or microsized particles are oriented in parallel with the surface of the substrate.

Here, the stretching of the plastic sheet 211 may be performed simultaneously in the horizontal and vertical directions, and may be sequentially performed in the horizontal and vertical directions. Therefore, the nanosized or microsized particles 201 are not only exfoliated, but also oriented in the flexible substrate, that is, a polymer film or a plastic film such that the nanosized or microsized particles 201 are oriented to a higher degree in parallel therewith as shown in FIG. 4.

Subsequently, in step 107 (S107), the surface of the plastic film 213 where the nanosized or microsized particles 201 are embedded is flattened. The plastic film 213 is flattened by coating it with an organic film using spin coating. Here, the organic film may be made of benzocyclobutene (BCB), an acrylate resin, an epoxy resin, polyvinyl phenol (PVP), polyvinyl alcohol (PVA) or the like.

The organic film serves as a barrier as well as serves to flatten the surface of the plastic film 213. This organic film barrier serves to prevent a stripper or an etchant from permeating into the plastic film 213 and thus from deforming a plastic substrate, and serves to prevent chemicals containing water from permeating into the plastic film 213.

Subsequently, in step 109 (S109), heat treatment is performed to discharge the gas outside the organic film, which is generated while curing the organic film. This heat treatment prevents bubbles from occurring in the organic film. Therefore, in this step, the organic solvent which is remained in the organic film is vaporized by the heat treatment, thereby curing the organic materials.

Further, this heat treatment not only cures the organic materials but also imparts uniformity to a plastic substrate when the heat treatment is performed at a suitable temperature for a predetermined period. Therefore, since the flexible plastic substrate according to the present invention has excellent mechanical, electrical and thermal properties and very low moisture permeability and oxygen permeability, it can efficiently block extraneous gases, such as oxygen, moisture and the like.

As described above, according to the present invention, nanosized or microsized plate-like particles are embedded in a molten polymer such that they are oriented in parallel with the surface of a polymer or plastic substrate so as to prevent extraneous moisture or oxygen from permeating into the polymer or plastic substrate, so that organic devices mounted on the polymer or plastic substrate are actively protected, thereby increasing the lifespan of a display device.

Further, according to the method of manufacturing a flexible display substrate having low permeability to moisture and oxygen as described above, nanosized or microsized plate-like particles are embedded and oriented in a flexible display substrate to block moisture or oxygen, so that the permeation rate of extraneous moisture or oxygen is decreased, with the result that the lifespan of a display device can be increased, and the flexible display substrate can be easily manufactured, thereby increasing the industrial applicability thereof in the field of flexible display substrates.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a flexible display substrate having reduced moisture permeability and reduced oxygen permeability, on which an organic device is mounted, the method comprising:
   uniformly dispersing at least one of, nanosized or microsized particles in a molten polymer matrix;
   forming the molten polymer matrix dispersed with the at least one of, the nanosized or microsized particles into plate-shaped molten polymer, and extruding the plate-shaped molten polymer between two extruding rollers to form at least one of, a polymer or a plastic sheet, to orient the at least one of, the nanosized or microsized particles in parallel with a surface of the at least one of, the polymer or the plastic sheet;
   stretching the at least one of, the polymer or the plastic sheet between a glass transition temperature and a melting point to form at least one of, a polymer or a plastic film, exfoliating the at least one of, the nanosized or microsized particles, and orienting the at least one of, the nanosized or microsized particles further in parallel with a surface of the at least one of, the polymer or the plastic film;
   coating the at least one of, the polymer or the plastic film with an organic film to flatten a surface of the flexible display substrate; and
   performing heat treatment to cure the organic film.

2. The method according to claim 1, wherein the plate-shaped molten polymer has a thickness of substantially about 1~10 mm, and the at least one of, the polymer or the plastic sheet has a thickness of substantially about 1 μm~3 mm, and the at least one of, the polymer or the plastic sheet comprises at least one of, polyestersulfone, polyethylene, polycarbonate, polystyrene, polyethylene terephthalate, polyethylene naphthalate, polybutylene terephthalate, polyphenylene sulfide, polypropylene, aramid, polyamideimide, polyimide, aromatic polyimide, polyetherimide, acrylonitrile butadienestyrene, or polyvinyl chloride.

3. The method according to claim 1, wherein the at least one of, the polymer or the plastic film has a thickness of substantially about 0.1~1000 μm.

4. The method according to claim 1, wherein a temperature of the extruding rollers is between a glass transition temperature and a melting point of the polymer.

5. The method according to claim 1, wherein the organic film that is used for coating the at least one of, the polymer or the plastic film to flatten the surface of the flexible display substrate comprises at least one of, benzocyclobutene (BCB), an acrylate resin, an epoxy resin, polyvinyl phenol (PVP), or polyvinyl alcohol (PVA).

6. The method according to claim 1, wherein each of the at least one of, the nanosized or microsized particles has a sheet structure.

7. The method according to claim 6, wherein the at least one of, the nanosized or microsized particles comprises at least one of, saponite particles, montmorillonite particles, bentonite particles, mica particles, or glass particles.

8. The method according to claim 6, wherein the at least one of, the nanosized or microsized particles comprises at least one of, Si, B, Li, Na, K, Mg, Ca, Ti, Al, Ba, Zn, Ga, Ge, Bi, or Fe.

9. The method according to claim 1, wherein the at least one of, the nanosized or microsized particles comprises at least one of, Si, B, Li, Na, K, Mg, Ca, Ti, Al, Ba, Zn, Ga, Ge, Bi, or Fe.

* * * * *